(12) United States Patent
Oh

(10) Patent No.: US 9,384,828 B2
(45) Date of Patent: Jul. 5, 2016

(54) ELECTRONIC DEVICE AND METHOD FOR OPERATING THE SAME

(71) Applicant: SK hynix Inc., Icheon-Si (KR)

(72) Inventor: Byoung-Chan Oh, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 142 days.

(21) Appl. No.: 14/191,300

(22) Filed: Feb. 26, 2014

(65) Prior Publication Data

US 2014/0241039 A1    Aug. 28, 2014

(30) Foreign Application Priority Data

Feb. 28, 2013   (KR) .................. 10-2013-0022140

(51) Int. Cl.
| | |
|---|---|
| *G11C 13/00* | (2006.01) |
| *G11C 11/56* | (2006.01) |
| *G11C 8/08* | (2006.01) |
| *G11C 16/08* | (2006.01) |

(52) U.S. Cl.
CPC .............. *G11C 11/5607* (2013.01); *G11C 8/08* (2013.01); *G11C 11/5678* (2013.01); *G11C 11/5685* (2013.01); *G11C 13/0002* (2013.01); *G11C 13/0004* (2013.01); *G11C 13/004* (2013.01); *G11C 13/0007* (2013.01); *G11C 16/08* (2013.01); *G11C 2211/5643* (2013.01); *G11C 2211/5645* (2013.01)

(58) Field of Classification Search
CPC .................................................. G11C 13/0038
USPC .......................................................... 365/148
See application file for complete search history.

(56) References Cited

U.S. PATENT DOCUMENTS

| | | | | |
|---|---|---|---|---|
| 6,621,729 | B1* | 9/2003 | Garni ..................... | G11C 7/062 365/158 |
| 7,903,455 | B2* | 3/2011 | Nozawa .................. | G11C 8/06 365/158 |
| 8,773,887 | B1* | 7/2014 | Naji ....................... | G11C 11/165 365/148 |
| 2008/0225603 | A1* | 9/2008 | Hein ...................... | G11C 7/1051 365/189.05 |
| 2010/0082898 | A1* | 4/2010 | Mangold ................. | G06F 12/02 711/113 |
| 2011/0289388 | A1* | 11/2011 | Nelson ................... | G11C 11/5642 714/773 |

FOREIGN PATENT DOCUMENTS

| | | |
|---|---|---|
| KR | 10-2009-0006631 | 1/2009 |
| KR | 10-2009-0126587 | 12/2009 |

\* cited by examiner

*Primary Examiner* — Hoai V Ho
*Assistant Examiner* — Tri Hoang
(74) *Attorney, Agent, or Firm* — Perkins Coie LLP

(57) ABSTRACT

An electronic device including a semiconductor memory. The semiconductor memory includes a plurality of variable resistance elements; a plurality of read voltage application terminals configured to supply different levels of read voltages to respective one ends of the plurality of variable resistance elements; and an analog-to-digital conversion unit configured to generate multi-bit digital data corresponding to a total current which is acquired by summing currents flowing through the plurality of variable resistance elements.

20 Claims, 8 Drawing Sheets

ELECTRONIC DEVICE AND METHOD FOR OPERATING THE SAME

CROSS-REFERENCE TO RELATED APPLICATIONS

The present application claims priority of Korean Patent Application No. 10-2013-0022140, entitled "SEMICONDUCTOR DEVICE AND, PROCESSOR AND SYSTEM INCLUDING THE SAME," and filed on Feb. 28, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device. An electronic device is provided which is capable of reading the data of a plurality of variable resistance elements by using one sense amplifier.

In one aspect, an electronic device is provided to include a semiconductor memory that includes: a plurality of variable resistance elements; a plurality of read voltage application terminals configured to supply different levels of read voltages to respective one ends of the plurality of variable resistance elements; and an analog-to-digital conversion unit configured to generate multi-bit digital data corresponding to a total current which is acquired by summing currents flowing through the plurality of variable resistance elements.

In some implementations, in a read operation, voltage differences between both ends of the plurality of variable resistance elements may be different from one another.

In some implementations, each of the plurality of variable resistance elements may include at least one of a metal oxide, a phase change substance, and a tunnel barrier layer is interposed between two ferromagnetic layers.

In another aspect, an electronic device is provided to include a semiconductor memory that includes: a common node; a plurality of read voltage application terminals configured to supply different levels of read voltages; a plurality of variable resistance elements having one ends which are electrically coupled to read voltage application terminals corresponding to them among the plurality of read voltage application terminals and the other ends which are electrically coupled to the common node in a read operation; and an analog-to-digital conversion unit configured to generate multi-bit digital data corresponding to a current flowing through the common node.

In some implementations, the semiconductor memory may further include: a current minor unit configured to minor the current flowing through the common node, and wherein the analog-to-digital conversion unit may generate the multi-bit digital data corresponding to a current mirrored by the current mirror unit.

In some implementations, the semiconductor memory may further include: a current minor unit configured to minor the current flowing through the common node; and a load configured to generate an input voltage corresponding to a current mirrored by the current minor unit, and wherein the analog-to-digital conversion unit may analog-to-digital convert the input voltage.

In some implementations, the semiconductor memory may further include: a plurality of switches configured to control electrical coupling between the plurality of variable resistance elements and the common node.

In some implementations, the semiconductor memory may further include: a plurality of diodes configured to control electrical coupling between the plurality of variable resistance elements and the common node.

In some implementations, each of the plurality of variable resistance elements may include a metal oxide or a phase change substance, and a tunnel barrier layer is interposed between two ferromagnetic layers.

In another aspect, an electronic device is provided to include a semiconductor memory that includes: a common node; a plurality of read voltage application terminals configured to supply different levels of read voltages; a plurality of first variable resistance elements having one ends which are electrically coupled to read voltage application terminals corresponding to them among the plurality of read voltage application terminals in a read operation; a plurality of second variable resistance elements having one ends which are electrically coupled to read voltage application terminals corresponding to them among the plurality of read voltage application terminals in a read operation; a plurality of first switches configured to couple the other ends of the plurality of first variable resistance elements to the common node when the plurality of first variable resistance elements are selected in the read operation; a plurality of second switches configured to couple the other ends of the plurality of second variable resistance elements to the common node when the plurality of second variable resistance elements are selected in the read operation; and an analog-to-digital conversion unit configured to generate multi-bit digital data corresponding to a current flowing through the common node.

In some implementations, the semiconductor memory may further include: a current minor unit configured to minor the current flowing through the common node, and wherein the analog-to-digital conversion unit may generate the multi-bit digital data corresponding to a current mirrored by the current mirror unit.

In some implementations, the semiconductor memory may further include: a current minor unit configured to minor the current flowing through the common node; and a load configured to generate an input voltage corresponding to a current mirrored by the current minor unit, and wherein the analog-to-digital conversion unit may analog-to-digital convert the input voltage.

In some implementations, each of the plurality of first variable resistance elements and the plurality of second variable resistance elements may include at least one of a metal oxide and a phase change substance, and a tunnel barrier layer may be interposed between two ferromagnetic layers.

In another aspect, an electronic device is provided to include a semiconductor memory that includes: a plurality of variable resistance elements of which resistance values change according to data stored therein; a plurality of read voltage application terminals supplying different levels of read voltages to respective variable resistance elements cause currents to flow through respective variable resistance elements; and an analog-to-digital conversion unit generating multi-bit digital data that depends on a total current acquired by summing the currents flowing through the respective variable resistance elements, thereby reading data stored in the respective variable resistance elements.

In some implementations, each of the plurality of variable resistance elements may include a metal oxide or a phase change substance.

In some examples, the semiconductor memory may further include: a common node that carries a current corresponding to the multi-bit digital data; and a current mirror unit configured to mirror the current flowing through the common node, wherein the analog-to-digital conversion unit generates the multi-bit digital data corresponding to a current mirrored by the current mirror unit.

In some examples, the semiconductor memory may further include: a load coupled to the mirroring node and providing an input voltage to the analog-to-digital conversion unit.

In some implementations, the input voltage depends on the magnitude of the total current.

In some implementations, the semiconductor memory may further include: a plurality of switches selectively provide electrical coupling between the plurality of variable resistance elements and the common node.

In some implementations, the semiconductor memory may further include: a plurality of diodes selectively provide electrical coupling between the plurality of variable resistance elements and the common node.

In another aspect, an electronic device is provided to include a semiconductor memory that includes: a first group of variable resistance elements of which resistance values change according to data stored therein; a second group of variable resistance elements of which resistance values change according to data stored therein; a plurality of read voltage application terminals configured to supply different read voltages to respective variable resistance elements of a selected group between the first group and the second group such that different levels of currents flow through respective variable resistance elements of the selected group; and an analog-to-digital conversion unit generating multi-bit digital data that depends on a total current acquired by summing the current flowing through the respective variable resistance elements of the selected group thereby reading data stored in the respective variable resistance elements in the selected group.

In some implementations, the semiconductor memory may further include: a first group of switches that are electrically coupled to variable resistance elements of the first group when the selected group corresponds to the first group; and a second group of switches that are electrically coupled to variable resistance elements of the second group when the selected group corresponds to the second group.

In some implementations, the semiconductor memory may further include: a current mirror unit having a common mode through which a total current obtained as the sum of the currents flowing through respective variable resistance elements of the selected group flows and a mirroring node through which the mirrored current as same as the total current flows.

In some implementations, the semiconductor memory may further include: a load coupled to the mirroring node and providing an input voltage to the analog-to-digital conversion unit.

In some implementations, the input voltage may depend on the magnitude of the total current.

In some implementations, each of the variable resistance elements may include a metal oxide or a phase change substance.

In some implementations, the electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In yet another aspect, a method for operating an electronic device is provided to include: providing a plurality of variable resistance elements of which resistance values change according to data stored therein; applying different levels of read voltages to respective variable resistance elements such that different levels of currents flow through respective variable resistance elements; and operating an analog-to-digital conversion unit to generate multi-bit digital data that depends on a total current acquired by summing the currents flowing through the respective variable resistance elements, thereby reading data stored in the respective variable resistance elements.

In some implementations, the operating of the analog-to-digital conversion unit may include: providing an input voltage to the analog-to-digital conversion unit that varies depending on the magnitude of the total current.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

A semiconductor device in accordance with implementations of the present disclosure may include a variable resistance element. In the following descriptions, a variable resistance element may exhibit a resistance variable characteristic and may include a single layer or a multi-layer. For example, a variable resistance element may include substances used in an RRAM, a PRAM, an MRAM, an FRAM, and so forth, for example, a chalcogenide-based compound, a transition metal compound, a ferroelectric, a ferromagnetic, and so forth. However, other implementations are possible so long as a variable resistance element has a resistance variable characteristic switched between different resistance states according to voltages or currents applied to both ends thereof.

In one embodiment, a variable resistance element may include a metal oxide. For example, the metal oxide may be a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO) and PCMO (Pr-CaMnO). Such a variable resistance element may exhibit a characteristic switched between different resistance states due to creation and extinction of current filaments through behavior of vacancies.

A variable resistance element may include a phase change substance. For example, the phase change substance may be a chalcogenide-based substance such as GST (Ge—Sb—Te). This variable resistance element may exhibit a characteristic switched between different resistance states by being stabilized in a crystalline state and an amorphous state by heat.

Further, a variable resistance element may include a structure in which a tunneling barrier layer is interposed between two ferromagnetic layers. The ferromagnetic layers may be formed using a substance such as NiFeCo and CoFe, and the tunneling barrier layer may be formed using a substance such as Al2O3. The variable resistance element may exhibit a characteristic that it is switched between different resistance states according to magnetization directions of the ferromagnetic layers. For example, in the case where the magnetization directions of the two ferromagnetic layers are parallel to each other, the variable resistance element may be in a low resistance state, and, in the case where the magnetization directions of the two ferromagnetic layers are anti-parallel to each other, the variable resistance element may be in a high resistance state.

Figure 1:
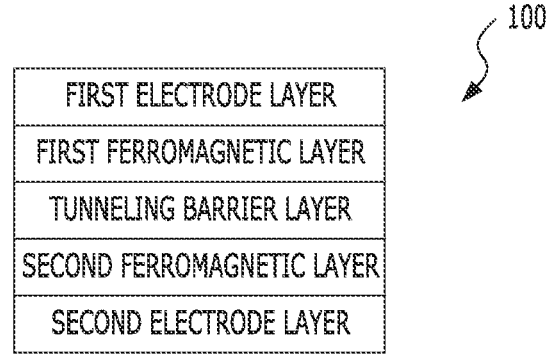
FIG. 1 is a diagram showing an example of a magnetic tunnel junction (MTJ) element as one of structures in which a tunneling barrier layer is interposed between two ferromagnetic layers.

FIG. 1 is a diagram showing an example of a magnetic tunnel junction (MTJ) element as one of structures in which a tunneling barrier layer is interposed between two ferromagnetic layers.

Referring to FIG. 1, an MTJ element 100 includes a first electrode layer as a top electrode, a second electrode layer as a bottom electrode, a first ferromagnetic layer and a second ferromagnetic layer as a pair of ferromagnetic layers, and a tunneling barrier layer which is formed between the pair of ferromagnetic layers.

The first ferromagnetic layer includes a free ferromagnetic layer of which magnetization direction may be changed according to a direction of current applied to the MTJ element 100, and the second ferromagnetic layer is a pinned ferromagnetic layer of which magnetization direction is pinned.

The MTJ element 100 operates to store a binary data bit of "0" or "1" as the resistance value is changed to a low value or a high value, respectively, according to a direction of current.

Figure 2A:
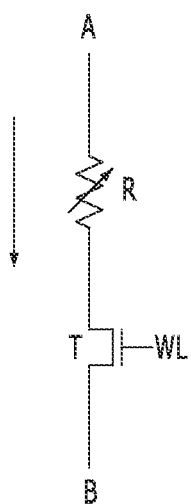
FIGS. 2A and 2B are diagrams explaining a principle of storing data in a variable resistance element.
Figure 2B:
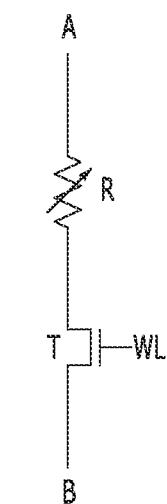

FIGS. 2A and 2B are views explaining a principle of storing data in a variable resistance element R. The variable resistance element R may include the MTJ element 100 described above with reference to FIG. 1.

FIG. 2A is a diagram explaining a principle of recording data with a low logic value in the variable resistance element R. In order to select the variable resistance element R in which data is to be stored, a word line WL coupled to the variable resistance element R is activated to turn on a transistor T. As a current flows from one end A to the other end B (in the direction indicated by the arrow), that is, from the first electrode layer as a top electrode to the second electrode layer as a bottom electrode in the MTJ element 100 shown in FIG. 1, the magnetization direction of the first ferromagnetic layer as a free ferromagnetic layer and the magnetization direction of the second ferromagnetic layer as a pinned ferromagnetic layer become parallel to each other, and the variable resistance element R is in a low resistance state. When the variable resistance element R is in the low resistance state, it is defined that 'low' data is stored in the variable resistance element R.

FIG. 2B is a diagram explaining a principle of recording data of a high logic value in the variable resistance element R. In a similar manner, the word line WL coupled to the variable resistance element R is activated to turn on the transistor T. As a current flows from the other end B to one end A (in the direction indicated by the arrow), that is, from the second electrode layer to the first electrode layer in the MTJ element 100 shown in FIG. 1, the magnetization direction of the first ferromagnetic layer and the magnetization direction of the second ferromagnetic layer become anti-parallel to each other, and the variable resistance element R is in a high resistance state. When the variable resistance element R is in the high resistance state, it is defined that 'high' data is stored in the variable resistance element R.

Figure 3:
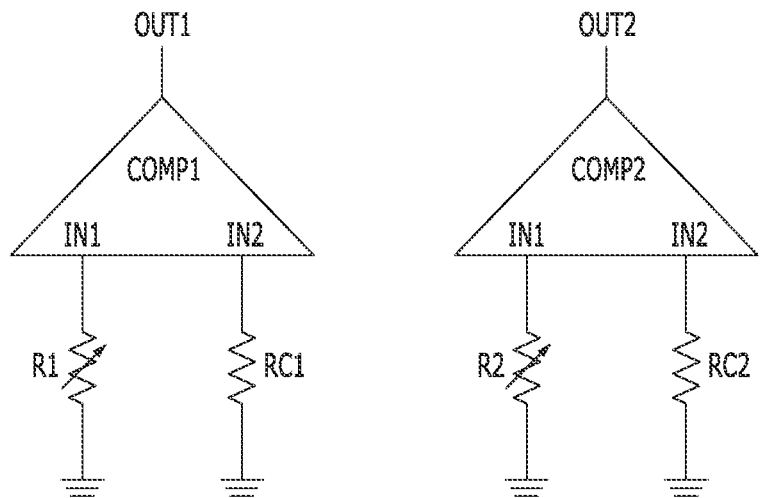
FIG. 3 is a diagram showing a configuration for reading the data stored in a variable resistance element.

FIG. 3 is a diagram showing a configuration for reading the data stored in a variable resistance element.

Referring to FIG. 3, a first variable resistance element R1, a first reference cell RC1, a first comparison unit COMP1, a second variable resistance element R2, a second reference cell RC2, and a second comparison unit COMP2 are provided. In implementations, a large number of elements, such as several hundred to several thousand variable resistance elements, may be disposed in the form of a matrix or array.

Each of the first variable resistance element R1 and the second variable resistance element R2 has a first resistance value $R_L$ when low data is stored therein, or a second resistance value $R_H$ greater than the first resistance value $R_L$ when high data is stored therein. Each of the first reference cell RC1 and the second reference cell RC2 has a resistance value that is greater than the first resistance value $R_L$ and smaller than the second resistance value $R_H$.

Assuming that the first variable resistance element R1 is designated by an address during a read operation. In this case, the first comparison unit COMP1 compares the resistance value of the first variable resistance element R1 coupled to a first input terminal IN1 and the resistance value of the first reference cell RC1 coupled to a second input terminal IN2, and outputs a comparison result to an output node OUT1. According to the value outputted to the output node OUT1, the data stored in the first variable resistance element R1 is determined. For example, in the case where the comparison result of the first comparison unit COMP1 indicates that the resistance value of the first variable resistance element R1 is smaller than the resistance value of the first reference cell RC1, it is determined that low data is stored in the first variable resistance element R1. In the case where the comparison result of the first comparison unit COMP1 indicates that the resistance value of the first variable resistance element R1 is greater than the resistance value of the first reference cell RC1, it is determined that high data is stored in the first variable resistance element R1. The second comparison unit COMP2 operates in the similar manner when the second variable resistance element R2 is designated by an address. For example, the second comparison unit COMP2 compares the resistance value of the second variable resistance element R2 coupled to a first input terminal IN1 and the resistance value of the second reference cell RC2 coupled to a second input terminal IN2, and outputs a comparison result to an output node OUT2. According to the value outputted to the output node OUT2, the data stored in the second variable resistance element R2 is determined.

Since one sense amplifier (comparison unit) may read the data stored in a memory cell, if a large number of variable resistance elements are disposed in the form of a matrix, a corresponding large number of sense amplifiers need to be included in the memory. For example, several tens to several thousands of sense amplifiers are included in the memory. In fact, it is an important performance index how many data can be read at a time in a memory, and thus, the number of sense amplifiers included in the memory tends to increase. However, the increase of the number of sense amplifiers can undesirably cause the size of the memory to increase.

In recognition of the above, the examples of memory circuits or devices of FIGS. 4 to 7 are provided.

Figure 4:
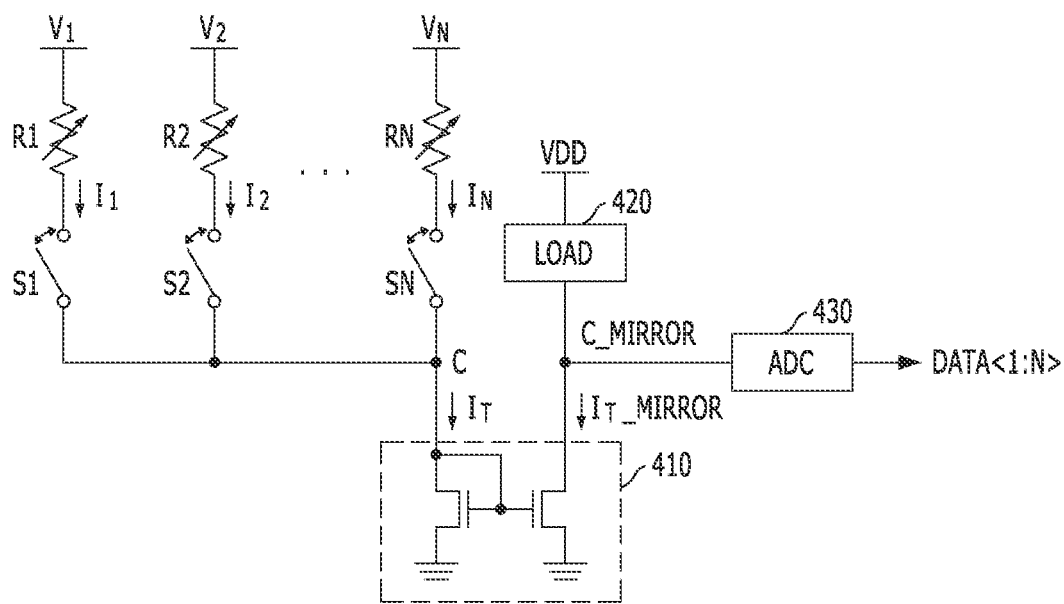
FIG. 4 is a configuration diagram of a semiconductor device.

FIG. 4 is a configuration diagram of a memory circuit or device.

Referring to FIG. 4, a memory circuit includes a plurality of variable resistance elements R1 to RN of which one terminal are respectively connected to a plurality of read voltage application terminals $V_1$ to $V_N$ for supplying different levels of read voltages to respective variable resistance elements R1 to RN, and an analog-to-digital conversion unit 430 configured to generate multi-bit digital data DATA<1:N> corresponding to total current $I_T$ acquired by summing currents $I_1$ to $I_N$ flowing through the plurality of variable resistance elements R1 to RN.

The resistance value of each of the plurality of variable resistance elements R1 to RN varies according to the value stored therein. In one implementation, the variable resistance element in which low data is stored has a low resistance state (with a resistance value of $R_L$), while the variable resistance element in which high data is stored has a high resistance state (with a resistance value of $R_H$. In other implementations, it may be envisaged that a low resistance state represents high data and a high resistance state represents low data. Various kinds of variable resistance elements can be used as long as resistance values vary according to the logic values of the data stored therein. While it is shown in FIG. 4 that the plurality of variable resistance elements R1 to RN are arranged in line, it is also possible that the variable resistance elements R1 to RN may be arranged in row and column directions in a matrix type.

The plurality of read voltage application terminals $V_1$ to $V_N$ apply different read voltages to one ends of the variable resistance elements R1 to RN in a read operation for reading the data stored in the variable resistance elements R1 to RN ($V_1 \neq V_2 \neq \ldots \neq V_N$). While it is shown in FIG. 4 that the read voltage application terminals $V_1$ to $V_N$ are directly coupled to one ends of the variable resistance elements R1 to RN, other implementations are also possible. For example, switches can be provided such that the read voltage application terminals $V_1$ to $V_N$ are coupled to one ends of the variable resistance elements R1 to RN through switches (not shown) only in the read operation. The levels of the read voltages supplied by the plurality of read voltage application terminals $V_1$ to $V_N$ to the variable resistance elements R1 to RN are different from one another.

Switches S1 to SN provide coupling between the other ends of the variable resistance elements R1 to RN and a common node C. In one implementation, all the variable resistance elements R1 to RN are electrically coupled to the common node C in the read operation. Various configurations can be made in relation to switches S1 to SN. For example, the switches S1 to SN may be omitted according to a design or the switches S1 to SN may be implemented by transistors or diodes.

The total current $I_T$ which is the sum of the currents $I_1$ to $I_N$ flowing through the variable resistance elements R1 to RN flows through the common node C. The current flowing through the common node C is mirrored on a mirroring node C_MIRROR by a current minor unit 410 which, in the illustrated example, includes a control transistor in a diode-connected configuration on the left side for receiving an input current $I_T$ and a "minor" transistor on the right side to generate the mirrored output current $I_{T\_MIRROR}$. In operation, the same amount of mirroring current $I_T$_MIRROR as the total current $I_T$ flows through the mirroring node C_MIRROR. A load 420 is coupled to the mirroring node C_MIRROR. As the mirroring current $I_T$_MIRROR is large, a voltage drop by the load 420 increases, and as a result, the voltage level of the mirroring node C_MIRROR falls. Conversely, as the mirroring current $I_T$_MIRROR is small, a voltage drop by the load 420 decreases, and as a result, the voltage level of the mirroring node C_MIRROR rises. As a consequence, the voltage level of the mirroring node C_MIRROR is determined by the current amount of the total current $I_T$. In one implementation, the load 420 may be designed using a resistor which is generally known in the art.

The analog-to-digital conversion unit 430 converts the voltage of the mirroring node C_MIRROR into the multi-bit digital data DATA<1:N>. Since the current amount of the total current $I_T$ flowing through the common node C changes according to the logic values of the data stored in the variable resistance elements R1 to RN and the voltage of the mirroring node C_MIRROR is determined according to the current amount of the total current $I_T$, the multi-bit digital data DATA<1:N> representing the logic values of the data stored in the variable resistance elements R1 to RN may be generated by performing an analog-to-digital conversion of the voltage of the mirroring node C_MIRROR. While it is exemplified in FIG. 4 that the analog-to-digital conversion unit 430 is provided with the voltage of the mirroring node C_MIRROR to generate the multi-bit digital data DATA<1:N>, it is to be noted that the analog-to-digital conversion unit 430 may be provided with the total current $I_T$ flowing through the common node C or the mirroring current $I_T$_MIRROR flowing through the mirroring node C_MIRROR to generate the multi-bit digital data DATA<1:N>. In other words, the analog-to-digital conversion unit 430 may generate the multi-bit digital data DATA<1:N> by performing an analog-to-digital conversion of a voltage or current corresponding to the total current $I_T$ flowing through the common node C.

Figure 5:
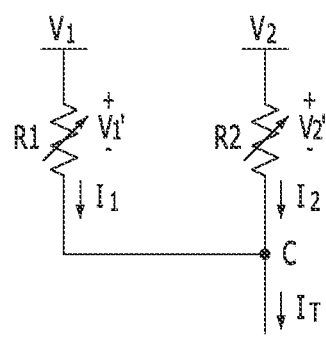
FIG. 5 is a diagram explaining how the data values of variable resistance elements are reflected on total current of FIG. 4.

FIG. 5 is a diagram explaining how the data values of the variable resistance elements R1 to RN are reflected on the total current $I_T$ of FIG. 4. For ease of explanation, the number of variable resistance elements included in the memory circuit or device are assumed to be N=2.

The voltage applied to the variable resistance element R1 is $(V_1-C)=V_1'$, and the voltage applied to the variable resistance element R2 is $(V_2-C)=V_2'$. Since $V_1$ is not equal to $V_2$, $V_1'$ is not equal to $V_2'$. Current flowing through the variable resistance element R1 is $I_1=V_1'/R_L=I_{1L}$ (when low data is stored in the variable resistance element R1) or $I_1=V_1'/R_H=R_H=I_{1H}$ (when high data is stored in the variable resistance element R1). Current flowing through the variable resistance element R2 is $I_2=V_2'/R_L=I_{2L}$ (when low data is stored in the variable resistance element R2) or $I_2=V_2'/R_H=I_{2H}$ (when high data is stored in the variable resistance element R2). Hereinbelow, the value of the total current $I_T$ will be calculated for each case (1) to (4) depending on the data stored in the variable resistance element R1 and the variable resistance element R2.

(1) Low data is stored in both variable resistance elements R1 and R2.

The value of the total current $I_T$ in the case where low data is stored in the variable resistance element R1 and low data is stored in the variable resistance element R2 (the value of $I_T$ in this case is defined as $I_a$)

$$I_1=I_{1L}=V_1'/R_L$$

$$I_2=I_{2L}=V_2'/R_L$$

$$I_T=I_a=I_{1L}+I_{2L}=V_1'/R_L+V_2'/R_L$$

(2) Low data is stored in variable resistance element R1 and high data is stored in variable resistance element R2.

The value of the total current $I_T$ in the case where low data is stored in the variable resistance element R1 and high data is stored in the variable resistance element R2 (the value of $I_T$ in this case is defined as $I_b$)

$$I_1=I_{1L}=V_1'/R_L$$

$$I_2=I_{2H}=V_2'/R_H$$

$$I_T=I_b=I_{1L}+I_{2H}=V_1'/R_L+V_2'/R_H$$

(3) High data is stored in variable resistance element R1 and low data is stored in variable resistance element R2.

The value of the total current $I_T$ in the case where high data is stored in the variable resistance element R1 and low data is stored in the variable resistance element R2 (the value of $I_T$ in this case is defined as $I_c$)

$$I_1=I_{1H}=V_1'/R_H$$

$$I_2=I_{2L}=V_2'/R_L$$

(4) High data is stored in both variable resistance elements R1 and R2.

The value of the total current $I_T$ in the case where high data is stored in the variable resistance element R1 and high data is stored in the variable resistance element R2 (the value of $I_T$ in this case is defined as $I_d$)

$$I_1=I_{1H}=V_1'/R_H$$

$$I_2=I_{2H}=V_2'/R_H$$

$$I_T=I_d=V_1'/R_H+V_2'/R_H$$

Figure 6:
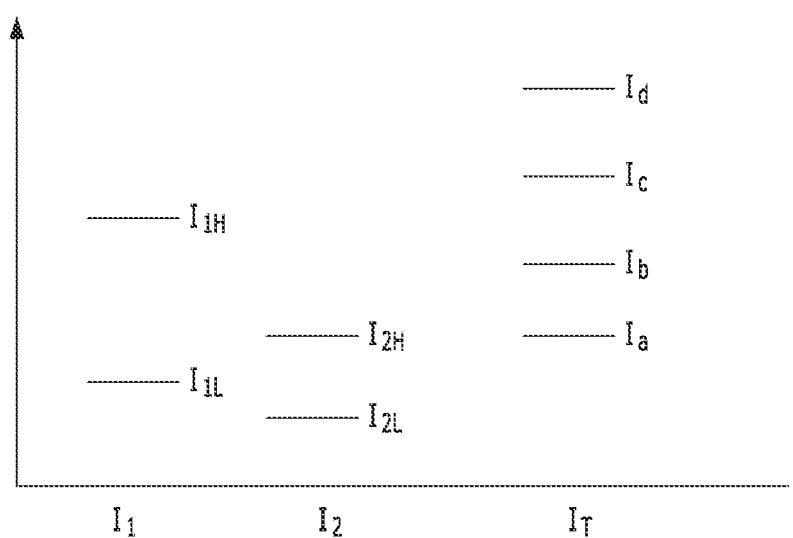
FIG. 6 is a diagram showing magnitudes of currents flowing through variable resistance elements and total current depending on logic values of data stored in variable resistance elements.

FIG. 6 shows how the value of the current $I_1$ flowing through the variable resistance element R1 changes according to the data stored in the variable resistance element R1 and how the value of the current $I_2$ flowing through the variable resistance element R2 changes according to the data stored in the variable resistance element R2. Also, it is possible to determine how the value of the total current $I_T$ changes according to the data stored in the variable resistance elements R1 and R2. Referring to FIG. 6, it is indicated that the values of the total current $I_T$ are all different from one another for every cases (1) to (4) above. Therefore, the analog-to-digital conversion unit 430 can perform the analog-to-digital conversion and generate the multi-bit digital data DATA<1:2> by which the data stored in the variable resistance elements R1 and R2 are recognized.

Although it is exemplified in FIGS. 5 and 6 that the number of variable resistance elements R1 and R2 is 2, other implementations are possible. For example, variable resistance elements R1 to RN may be included in the memory circuit or device. In this case, the different voltages $V_1$ to $V_N$ applied to the variable resistance elements R1 to RN.

Figure 7:
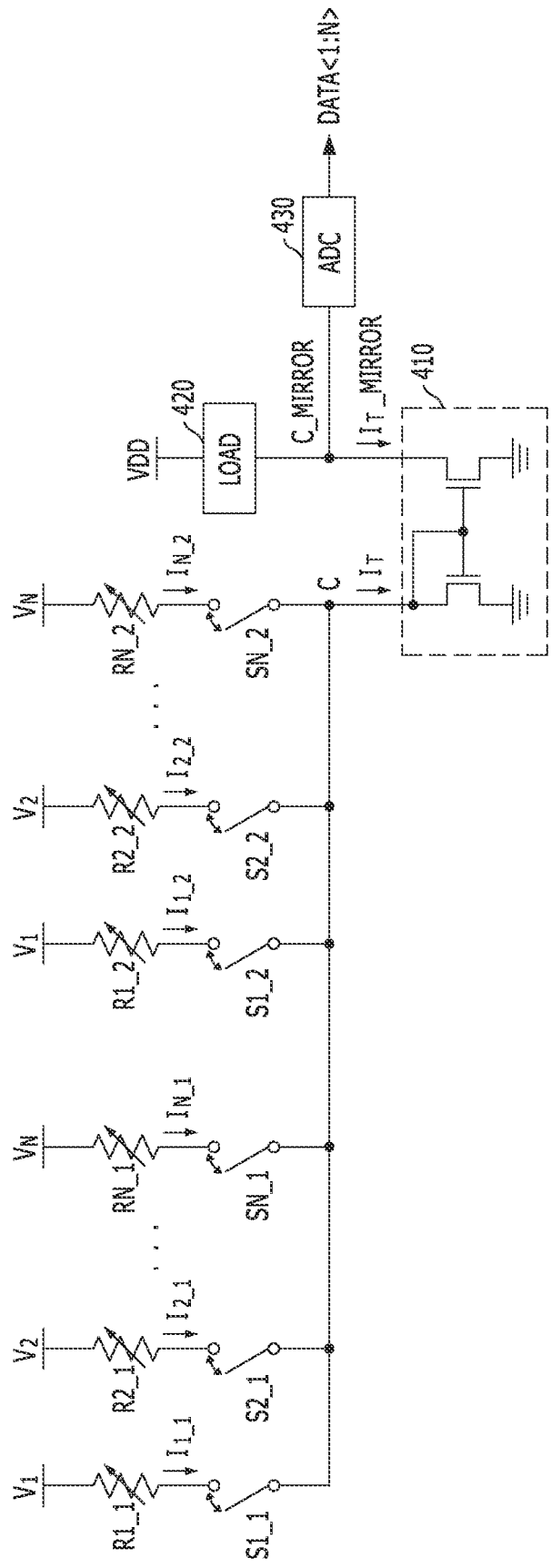
FIG. 7 is a configuration diagram of a semiconductor device.

FIG. 7 is a configuration diagram of a memory circuit or device.

Referring to FIG. 7, a memory circuit includes a common node C, a plurality of read voltage application terminals $V_1$ to $V_N$ for supplying different levels of read voltages, a plurality of first variable resistance elements R1_1 to RN_1 one ends of which are electrically coupled to read voltage application terminals, respectively, in a read operation, a plurality of second variable resistance elements R1_2 to RN_2 one ends of which are electrically coupled to read voltage application terminals, respectively, in a read operation, a plurality of first switches S1_1 to SN_1 for coupling the other ends of the plurality of first variable resistance elements R1_1 to RN_1 to the common node C when the plurality of first variable resistance elements R1_1 to RN_1 are selected in the read operation, a plurality of second switches S1_2 to SN_2 for coupling the other ends of the plurality of second variable resistance elements R1_2 to RN_2 to the common node C when the plurality of second variable resistance elements R1_2 to RN_2 are selected in the read operation, and an analog-to-digital conversion unit 430 configured to generate multi-bit digital data DATA<1:N> corresponding to current $I_T$ flowing through the common node C.

The resistance value of each of the plurality of first variable resistance elements R1_1 to RN_1 varies according to the value stored therein. In one implementation, if low data is stored therein, the variable resistance element has a low resistance state (with a resistance value of $R_L$) and, if high data is stored therein, the variable resistance element has a high resistance state (with a resistance value of $R_H$). In other implementations, it may be envisaged that a low resistance state represents high data and a high resistance state represents low data. Various kinds of variable resistance elements can be used as long as resistance values vary according to the logic values of the data stored therein. While it is shown in FIG. 7 that the plurality of first variable resistance elements R1_1 to RN_1 are arranged in line, it is also possible that the first variable resistance elements R1_1 to RN_1 may be arranged in row and column directions in a matrix type.

The plurality of second variable resistance elements R1_2 to RN_2 have the same configurations as the plurality of first variable resistance elements R1_1 to RN_1. In the case where low data is stored therein, the variable resistance element has a low resistance state (with a resistance value of $R_L$), and, in the case where high data is stored therein, the variable resistance element has a high resistance state (with a resistance value of $R_H$).

The plurality of read voltage application terminals $V_1$ to $V_N$ apply different read voltages to the first variable resistance elements R1_1 to RN_1 and the second variable resistance elements R1_2 to RN_2 in the read operation ($V_1 \neq V_2 \neq \ldots \neq V_N$). While it is shown in FIG. 7 that the read voltage application terminals $V_1$ to $V_N$ are directly coupled to one ends of the variable resistance elements R1_1 to RN_1 and R1_2 to RN_2, other implementations are also possible. For example, switches can be provided such that the read voltage application terminals $V_1$ to $V_N$ are coupled to one ends of the variable resistance elements R1_1 to RN_1 and R1_2 to RN_2 through switches (not shown) only in the read operation. The levels of the read voltages supplied by the plurality of read voltage application terminals $V_1$ to $V_N$ to the variable resistance elements are different from one another.

The first switches S1_1 to SN_1 electrically couple the other ends of the first variable resistance elements R1_1 to RN_1 to the common node C when the first variable resistance elements R1_1 to RN_1 are selected to perform the read operation. In this case, the total current $I_T$ flowing through the common node C becomes the sum of currents $I_{1\_1}$ to $I_{N\_1}$ flowing through the first variable resistance elements R1_1 to RN_1.

The second switches S1_2 to SN_2 electrically couple the other ends of the second variable resistance elements R1_2 to RN_2 to the common node C when the second variable resistance elements R1_2 to RN_2 are selected to perform the read operation. In this case, the total current $I_T$ flowing through the common node C becomes the sum of currents $I_{1\_2}$ to $I_{N\_2}$ flowing through the second variable resistance elements R1_2 to RN_2.

The total current $I_T$ flowing through the common node C is mirrored on a mirroring node C_MIRROR by a current mirror unit 410. The voltage level of the mirroring node C_MIRROR is determined by current $I_T$_MIRROR mirrored on the mirroring node C_MIRROR and a load 420. The voltage level of the mirroring node C_MIRROR is converted into the multi-bit digital data DATA<1:N> by the analog-to-digital conversion unit 430. As a result, the data of the first variable resistance elements R1_1 to RN_1 are simultaneously sensed by the analog-to-digital conversion unit 430 when the first switches S1_1 to SN_1 are turned on, and the data of the second variable resistance elements R1_2 to RN_2 are simultaneously sensed by the analog-to-digital conversion unit 430 when the second switches S1_2 to SN_2 are turned on.

The implementation of FIG. 7 may be used to selectively sense the data of a plurality of variable resistance elements.

The above and other memory circuits or semiconductor devices based on the disclosed technology can be used in a range of devices or systems. FIGS. 8-12 provide some examples of devices or systems that can implement the memory circuits disclosed herein.

Figure 8:
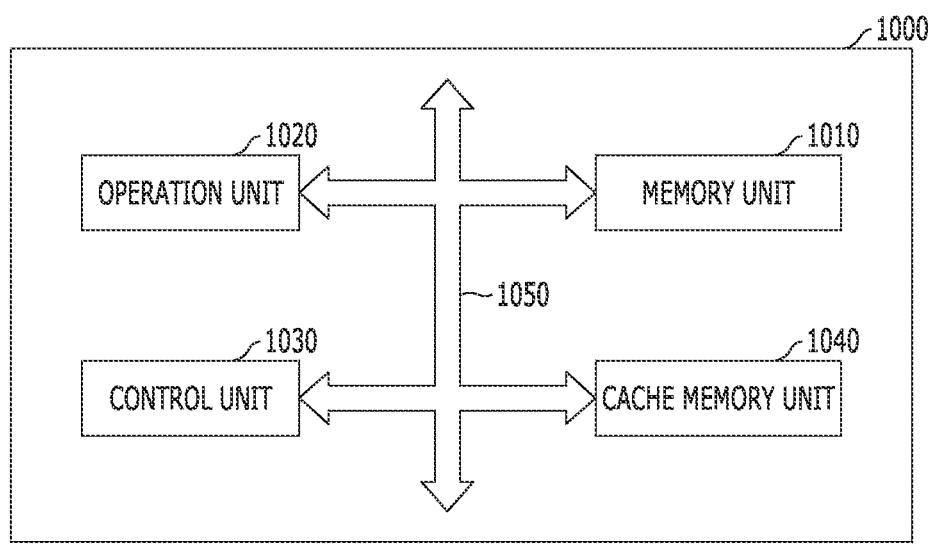
FIG. 8 shows an example of a configuration diagram of a microprocessor implementing memory circuitry based on the disclosed technology.

FIG. 8 shows an example of a configuration diagram of a microprocessor based on another implementation of the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described memory circuits in accordance with the implementations. For example, the memory unit 1010 implementation may include a plurality of variable resistance elements, a plurality of read voltage application terminals configured to supply different levels of read voltages to respective one ends of the plurality of variable resistance elements, and an analog-to-digital conversion unit configured to generate multi-bit digital data corresponding to a total current which is acquired by summing currents flowing through the plurality of variable resistance elements. Since the data of a plurality of variable resistance elements may be simultaneously read using one sense amplifier circuit, the area of a circuit may be reduced and a read operation may be performed at a high speed. Through this, the size of the memory unit 1010 may be reduced and the operating speed of the memory unit 1010 may be improved. Further, the size of the microprocessor 1000 may be reduced while improving performance.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
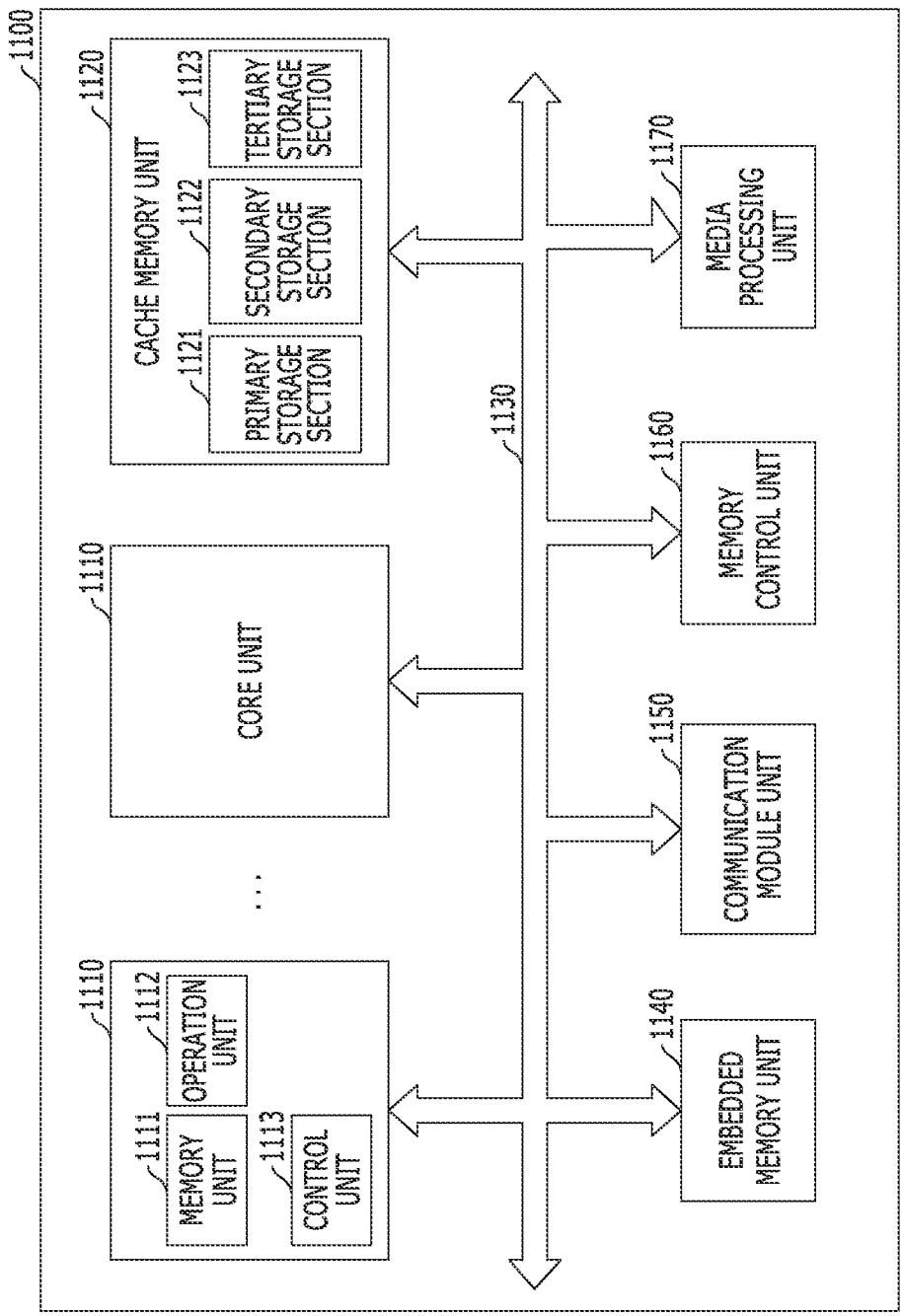
FIG. 9 shows an example of a configuration diagram of a processor implementing memory circuitry based on the disclosed technology.

FIG. 9 is a configuration diagram of a processor based on another implementation of the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling iinput and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described memory circuits in accordance with the implementations. For example, the cache memory unit 1120 implementation may include a plurality of variable resistance elements, a plurality of read voltage application terminals configured to supply different levels of read voltages to respective one ends of the plurality of variable resistance elements, and an analog-to-digital conversion unit configured to generate multi-bit digital data corresponding to a total current which is acquired by summing currents flowing through the plurality of variable resistance elements. Since the data of a plurality of variable resistance elements may be simultaneously read using one sense amplifier circuit, the area of a circuit may be reduced and a read operation may be performed at a high speed. Through this, the size of the cache memory unit 1120 may be reduced and the operating speed of the cache memory unit 1120 may be improved. Further, the size of the core unit 1110 may be reduced, while improving performance.

Although it was shown in FIG. 9 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
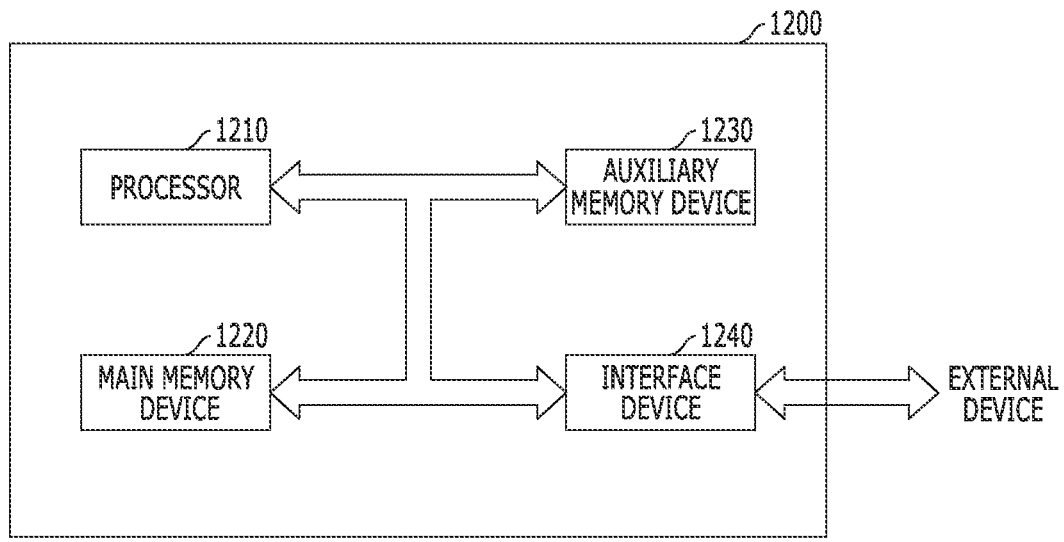
FIG. 10 shows an example of a configuration diagram of a system implementing memory circuitry based on the disclosed technology.

FIG. 10 is a configuration diagram of a system based on another implementation of the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a plurality of variable resistance elements, a plurality of read voltage application terminals configured to supply different levels of read voltages to respective one ends of the plurality of variable resistance elements, and an analog-to-digital conversion unit configured to generate multi-bit digital data corresponding to a total current which is acquired by summing currents flowing through the plurality of variable resistance elements.

Since the data of a plurality of variable resistance elements may be simultaneously read using one sense amplifier circuit, the area of a circuit may be reduced and a read operation may be performed at a high speed. Through this, the size of the main memory device 1220 may be reduced and the operating speed of the main memory device 1220 may be improved. Further, the size of the system 1200 may be reduced, while improving performance.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a plurality of variable resistance elements, a plurality of read voltage application terminals configured to supply different levels of read voltages to respective one ends of the plurality of variable resistance elements, and an analog-to-digital conversion unit configured to generate multi-bit digital data corresponding to a total current which is acquired by summing currents flowing through the plurality of variable resistance elements. Since the data of a plurality of variable resistance elements may be simultaneously read using one sense amplifier circuit, the area of a circuit may be reduced and a read operation may be performed at a high speed. Through this, the size of the auxiliary memory device 1230 may be reduced and the operating speed of the auxiliary memory device 1230 may be improved. Further, the size of the system 1200 may be reduced, while improving portability and performance.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
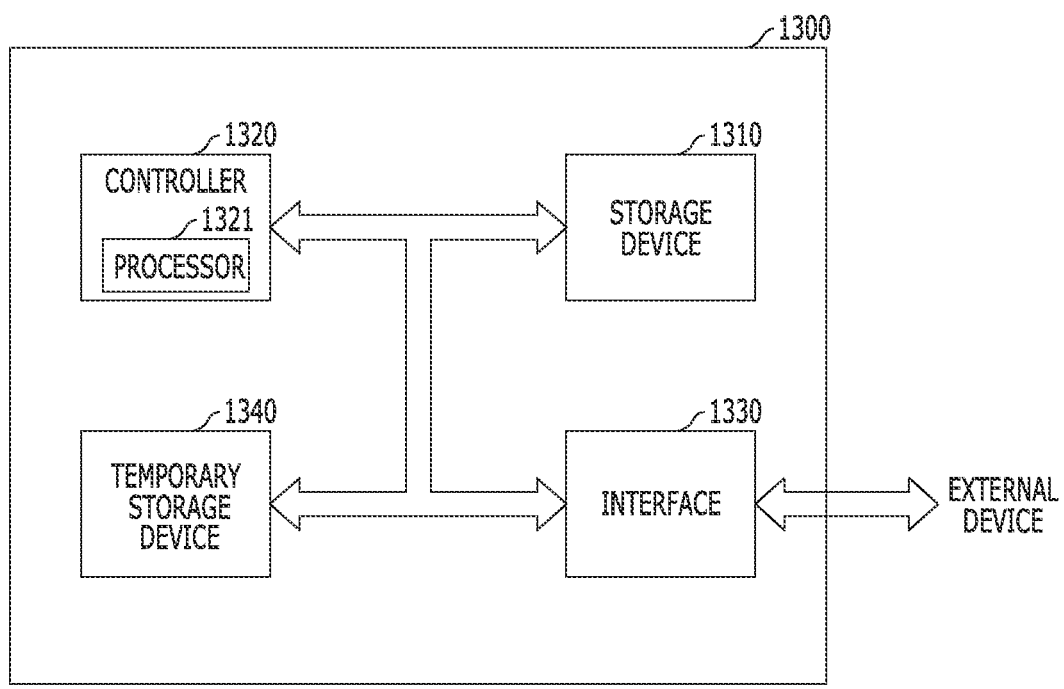
FIG. 11 shows an example of a configuration diagram of a data storage system implementing memory circuitry based on the disclosed technology.

FIG. 11 is a configuration diagram of a data storage system based on another implementation of the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a plurality of variable resistance elements, a plurality of read voltage application terminals configured to supply different levels of read voltages to respective one ends of the plurality of variable resistance elements, and an analog-to-digital conversion unit configured to generate multi-bit digital data corresponding to a total current which is acquired by summing currents flowing through the plurality of variable resistance elements. Since the data of a plurality of variable resistance elements may be simultaneously read using one sense amplifier circuit, the area of a circuit may be reduced and a read operation may be performed at a high speed. Through this, the size of the storage device 1310 or the temporary storage device 1340 may be reduced and the operating speed of the storage device 1310 or the temporary storage device 1340 may be improved. Further, the size of the data storage system 1300 may be reduced, while improving portability and performance.

Figure 12:
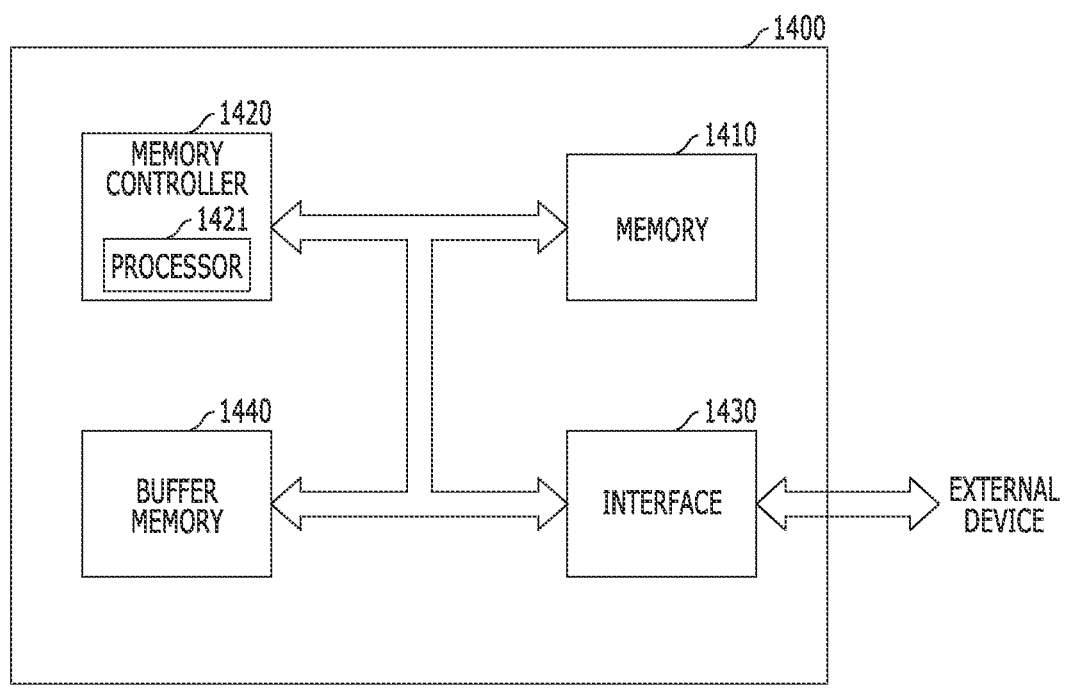
FIG. 12 shows an example of a configuration diagram of a memory system implementing memory circuitry based on the disclosed technology.

FIG. 12 is a configuration diagram of a memory system based on another implementation of the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a plurality of variable resistance elements, a plurality of read voltage application terminals configured to supply different levels of read voltages to respective one ends of the plurality of variable resistance elements, and an analog-to-digital conversion unit configured to generate multi-bit digital data corresponding to a total current which is acquired by summing currents flowing through the plurality of variable resistance elements. Since the data of a plurality of variable resistance elements may be simultaneously read using one sense amplifier circuit, the area of a circuit may be reduced and a read operation may be performed at a high speed. Through this, the size of the memory 1410 may be reduced and the operating speed of the memory 1410 may be improved. Further, the size of the memory system 1400 may be reduced, while improving portability and performance.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described memory circuits in accordance with the implementations. The buffer memory 1440 implementation may include a plurality of variable resistance elements, a plurality of read voltage application terminals configured to supply different levels of read voltages to respective one ends of the plurality of variable resistance elements, and an analog-to-digital conversion unit configured to generate multi-bit digital data corresponding to a total current which is acquired by summing currents flowing through the plurality of variable resistance elements. Since the data of a plurality of variable resistance elements may be simultaneously read using one sense amplifier circuit, the area of a circuit may be reduced and a read operation may be performed at a high speed. Through this, the size of the buffer memory 1440 may be reduced and the operating speed of the buffer memory 1440 may be improved. Further, the size of the memory system 1400 may be reduced, while improving portability and performance.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

As is apparent from the above descriptions, according to the electronic device in accordance with the above-described implementations, the data of a plurality of variable resistance elements may be simultaneously read using one sense amplifier circuit. Therefore, the area of a circuit may be reduced, and a read operation may be performed at a high speed.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
a plurality of variable resistance elements of which resistance values change according to data stored therein;
a plurality of read voltage application terminals supplying different levels of read voltages to respective variable resistance elements cause currents to flow through respective variable resistance elements, wherein magnitudes of the currents flowing through respective variable resistance elements are determined by respective read voltages and resistance values of respective variable resistance elements; and
an analog-to-digital conversion unit generating multi-bit digital data that depends on a total current acquired by summing the currents flowing through the respective variable resistance elements, thereby reading data stored in the respective variable resistance elements.

2. The electronic device according to claim 1, wherein each of the plurality of variable resistance elements includes a metal oxide or a phase change substance.

3. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the variable resistance element is part of the cache memory unit in the processor.

4. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit that includes the variable resistance element is part of the auxiliary memory device or the main memory device in the processing system.

5. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the variable resistance element is part of the storage device or the temporary storage device in the data storage system.

6. The electronic device according to claim 1, wherein the semiconductor memory further comprises:
a common node that carries a current corresponding to the multi-bit digital data; and
a current mirror unit configured to mirror the current flowing through the common node,
wherein the analog-to-digital conversion unit generates the multi-bit digital data corresponding to a current mirrored by the current mirror unit.

7. The electronic device according to claim 6, wherein the semiconductor memory further comprises:
a load coupled to the mirroring node and providing an input voltage to the analog-to-digital conversion unit.

8. The electronic device according to claim 7,
wherein the input voltage depends on the magnitude of the total current.

9. The electronic device according to claim 6, wherein the semiconductor memory further comprises:
a plurality of switches selectively provide electrical coupling between the plurality of variable resistance elements and the common node.

10. The electronic device according to claim 6, wherein the semiconductor memory further comprises:
a plurality of diodes selectively provide electrical coupling between the plurality of variable resistance elements and the common node.

11. An electronic device including a semiconductor memory, the semiconductor memory comprising:
a first group of variable resistance elements of which resistance values change according to data stored therein;
a second group of variable resistance elements of which resistance values change according to data stored therein;
a plurality of read voltage application terminals configured to supply different read voltages to respective variable resistance elements of a selected group between the first group and the second group such that different levels of currents flow through respective variable resistance elements of the selected group, wherein magnitudes of the current flowing through respective variable resistance elements of the selected group are determined by respective read voltages and resistance values of respective variable resistance elements of the selected group; and
an analog-to-digital conversion unit generating multi-bit digital data that depends on a total current acquired by summing the current flowing through the respective variable resistance elements of the selected group thereby reading data stored in the respective variable resistance elements in the selected group.

12. The electronic device according to claim 11,
wherein the semiconductor memory further comprises:
a first group of switches that are electrically coupled to variable resistance elements of the first group when the selected group corresponds to the first group; and
a second group of switches that are electrically coupled to variable resistance elements of the second group when the selected group corresponds to the second group.

13. The electronic device according to claim 11,
wherein the semiconductor memory further comprises:
a current mirror unit having a common mode through which a total current obtained as the sum of the currents flowing through respective variable resistance elements of the selected group flows and a mirroring node through which the mirrored current as same as the total current flows.

14. The electronic device according to claim 13,
wherein the semiconductor memory further comprises:
a load coupled to the mirroring node and providing an input voltage to the analog-to-digital conversion unit.

15. The electronic device according to claim 14,
wherein the input voltage depends on the magnitude of the total current.

16. The electronic device according to claim 11, wherein each of the variable resistance elements includes a metal oxide or a phase change substance.

17. The electronic device according to claim 11, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the variable resistance element is part of the cache memory unit in the processor.

18. The electronic device according to claim 11, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit that includes the variable resistance element is part of the auxiliary memory device or the main memory device in the processing system.

19. The electronic device according to claim 11, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the variable resistance element is part of the storage device or the temporary storage device in the data storage system.

20. The electronic device according to claim 11, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit that includes the variable resistance element is part of the memory or the buffer memory in the memory system.

* * * * *